United States Patent [19]

Ettinger

[11] Patent Number: 4,719,425
[45] Date of Patent: Jan. 12, 1988

[54] NMR IMAGING METHOD AND APPARATUS

[75] Inventor: Kamil V. Ettinger, Aberdeen, Scotland

[73] Assignee: Scientific Innovations, Inc., Wainscott, N.Y.

[21] Appl. No.: 852,435

[22] Filed: Apr. 15, 1986

[51] Int. Cl.⁴ ............................................. G01R 33/20
[52] U.S. Cl. ................................... 324/316; 128/653; 128/731; 324/309
[58] Field of Search ............... 324/300, 307, 309, 312, 324/316, 318; 128/653, 731

[56] References Cited

U.S. PATENT DOCUMENTS

| | | | |
|---|---|---|---|
| 3,100,280 | 8/1963 | Hyde | 324/316 |
| 3,250,985 | 5/1966 | Hyde | 324/316 |
| 3,358,222 | 12/1967 | Hyde | 324/300 |
| 3,532,965 | 10/1970 | Ruban | 324/316 |
| 3,951,134 | 4/1976 | Malech | 128/653 |
| 4,280,096 | 7/1981 | Karthe et al. | 324/316 |
| 4,296,378 | 10/1981 | King | 324/316 |
| 4,455,527 | 6/1984 | Singer | 324/316 |

OTHER PUBLICATIONS

D. S. Holder, "The Potential Use of Electron Spin Resonance Impedance Measurement to Image Neuronal Electrical Activity in the Human Brain", Electric and Magnetic Fields in Medicine and Biology, Proc. Conf., London, 1985, IEE Conf. Pub. 257, London, 1985.
J. P. Barach, et al., "Experiments on the Magnetic Field of Nerve Action Potentials", J. Appl. Phys., vol. 51, No. 8, Aug. 1980.
John R. Bales, et al., "Use of High-Resolution Proton Nuclear Magnetic Resonance Spectroscopy for Rapid Multi-Component Analysis of Urine", Clinical Chemistry, vol. 30, No. 3, 1984.
Paul A. Bottomley, et al., "Anatomy and Metabolism of the Normal Human Brain Studied by Magnetic Resonance at 1.5 Tesla", Radiology 1984; vol. 150, No. 2, 441-446.

Primary Examiner—Michael J. Tokar
Assistant Examiner—Kevin D. O'Shea
Attorney, Agent, or Firm—Scully, Scott, Murphy & Presser

[57] ABSTRACT

A method and apparatus for imaging the concentration of paramagnetic species inside a sample is disclosed wherein a sample is placed inside an NMR imager and an additional microwave field is introduced. A microwave field is chosen in such a way that there is a simultaneous resonance of nuclear spins (protons) and electrons in the same main magnetic field. The microwave signal is modulated which provides a modulation transfer to the intensity of the NMR signal. The modulation is extracted from the NMR signal to produce an image representative of the local electron spin resonance (ESR) and thereby the concentration of paramagnetic species in the sample. In addition, electrical activity of the brain can be detected and measured by measuring the broadening of the width of NMR spectral lines. A discharging neuron in the brain introduces an inhomogeneity in the magnetic field which reveals itself as a broadening of resonance lines which can be measured to determine the neuron discharge current flux.

23 Claims, 6 Drawing Figures

NMR IMAGING METHOD AND APPARATUS

BACKGROUND OF THE INVENTION

1. Field of the Invention

The present invention is directed to NMR imaging techniques for imaging paramagnetic species inside a sample and for determining information on the electrical activity of the brain of a subject.

2. Description of the Prior Art

Electron spin resonance (ESR) has been used to measure the concentration of paramagnetic species in samples for many years. As disclosed in U.S. Pat. No. 3,090,003, the ESR technique uses microwave frequency signals transmitted to a resonator cavity within which is placed the sample. The cavity is within a homogeneous magnetic field. The measurement of the concentration of paramagnetic species, such as radicals, transition metal atoms, excited molecules, etc., inside a man or a large animal has long been regarded as impossible because of the difficulty in constructing a cavity that would encompass the large volume of tissue, particularly when dealing with a living person.

In addition, imaging of paramagnetic species using the ESR technique is in a much earlier stage of development than NMR. For example, spatial distributions of paramagnetic species have been measured by a spectrometer using ESR techniques in U.S. Pat. No. 4,280,096. Gradient coils similar to those used in NMR are used to produce one-dimensional images. NMR and ESR techniques have been combined to record and observe spectra in electron nuclear double resonance (ENDOR). An ESR spectrometer is adapted to resonate nuclear spins by adding a radio frequency oscillator to the system. Examples of the ENDOR technique can be seen in U.S. Pat. Nos. 3,532,965 and 3,250,985.

In the prior art gyromagnetic systems, paramagnetic species are not detected directly by means of their electron resonance but by their effect on the relaxation times of nuclei undergoing nuclear spin resonance. The direct observation of ESR in large objects has been frustrated because of difficulties in designing a resonator with sufficiently high quality factor (Q) of dimensions many times larger than the operating wavelength.

Recently, Holder proposed to use ESR at about 1 GHZ to obtain images of the human head, using a technique derived from NMR imaging; referring to Holder, The Potential Use of ESR or Impedance Measurement to Image Neuronal Activity in the Human Brain, Electric and Magnetic Fields in Medicine and Biology, Conference Proceedings, London, 1985, IEEE Conference Publication 257. Localization of the neural activity of the brain is at present possible only by means of electroencephalography, but the precision of localization is rather low, at most of an order of 1-2 cm. The deeper structures in the brain are even less accessible and the localization rapidly deteriorates. Furthermore, localization by means of EEG lacks a reference grid or an anatomical reference to known parts of the brain. At this time, most accurate in localization of averaged metabolic activity is Positron Emitter Imaging, but it is by no means certain that the metabolic map will correspond to the electric activity map.

However, from the viewpoint of neurology, even more useful information can be obtained from the reconstructed images of the electrical firing of nerve cells in the human brain, since this would allow analysis of functional activity of neuroatomical pathways which cannot be achieved with the current techniques. Holder investigated the possibility that neuronal firing can be detected by a form of electromagnetic radiation which can then be reconstructed to form three-dimensional images of this functional activity. Holder teaches the use of ESR and impedance imaging as giving the best results. Holder states that NMR, being well established for spectroscopy and imaging, could be employed to detect neuronal firing, but that current flux from ions moving across the neuronal membrane would be too small to be detectable by NMR.

SUMMARY OF THE INVENTION

The present invention is directed to magnetic resonance imaging (MRI) methods and apparatus for measuring and imaging the concentration of paramagnetic species from a sample. In addition, an MRI method is disclosed for detecting and measuring electrical activity of the brain. In one embodiment of the present invention, an imaging technique termed Nuclear Electron Double Resonance (NEDOR) starts with a conventional NMR imaging apparatus and includes a high frequency resonator or radiator such as is used in ESR techniques. A sample, such as a human body, is placed inside the main magnetic field coils of the NMR imager. A radio frequency (RF) pulse is applied via RF coils to excite to resonance a plurality of nuclear spins producing an NMR signal. A microwave (MW) pulse is applied via a high frequency resonator or radiator to excite to resonance a plurality of electron spins within the sample. The RF and MW pulses simultaneously resonate the nuclear and electron spins within the sample. The intensity of the MW signal is modulated, which translates into a modulation of the intensity of the NMR signal. The modulation is extracted from the NMR signal to produce an image representative of the local ESR and thereby the concentration of paramagnetic species in the sample. In a preferred embodiment, the RF coil is also used as the MW resonator.

Electron spin resonance is the study of properties and molecules containing unpaired electrons by observing the magnetic fields at which the electrons come into resonance within an applied radiation field of definite frequency. Nuclear magnetic resonance monitors the reversal of nuclear magnetic moments wherein the nucleus with a net spin has been excited to resonance. For biological and other purposes, it is sometimes necessary to artificially introduce the unpaired electrons, into the sample in the form of paramagnetic tracers. In one embodiment, paramagnetic tracers are introduced into the sample to improve the differentiation between different tissues and improves detection of pathological changes.

In a further embodiment, a plurality of NMR spectral lines having a defined width are derived from the modulated NMR signal. It has been determined by the applicant, that the width of the spectral lines is broadened due to the electric activity in the brain. The discharge of a neuron in the brain introduces an inhomogeneity into the main magnetic field. The contribution of the spectral line width due to the electric activity is measured, which can provide a measurement of the intensity of neuron discharges in the brain.

DETAILED DESCRIPTION OF THE INVENTION

Figure 1:
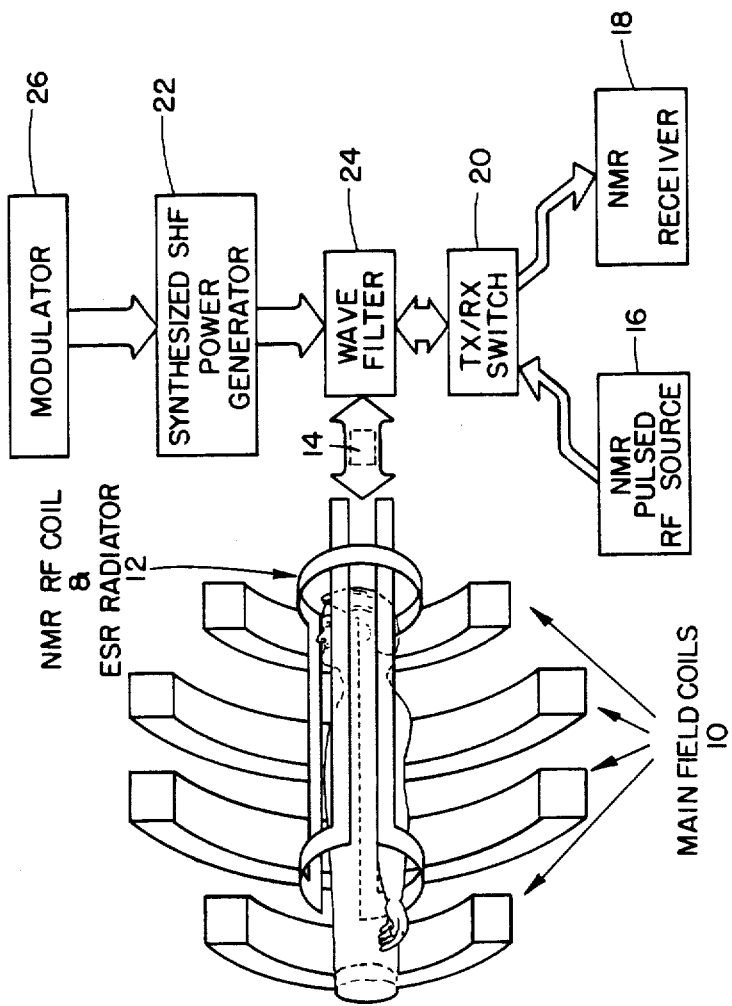
FIG. 1 is a partial sketch and block diagram of one embodiment of the present invention.

Referring now to the drawings, FIG. 1 shows an MRI apparatus having main field coils 10 for generating a homogeneous magnetic field. An RF coil 12 is arranged within the main fields coils 10 with its axis parallel to the axis of the main field coils. The coil 12 may act as both the radio frequency coil and the ERS microwave radiator. Alternatively, a separate high frequency radiator may be provided at 14 such as a horn, slotted transmission line or other equivalent structure.

In the former embodiment, the radio frequency coils of the NMR imager would be designed such that they can also perform the function of the high frequency resonator. The saddle-shaped coil structures utilized for the RF field can be utilized as both a distributed transmission line and resonator. The helicoidal coils can incorporate a slot system which can be used to radiate very high frequencies into the object placed inside the turns of the main field.

The NMR imager includes a pulsed RF source 16 and an NMR receiver 18. A switch 20 operates to permit selective transmission of the RF pulse and reception of the NMR signal from the sample. A synthesized super high frequency power generator 22 generates the microwave frequency pulse signal to the resonator. The microwave pulse in this application refers to a burst of electromagnetic energy of a frequency suitable to cause ESR transitions. A wave filter 24 is provided to permit only the desired frequency signal to be applied to the sample. A modulator 26 is coupled to the generator 22 to modulate the MW output signal.

The operation of the invention will first be described through the laws of electromagnetics. Nuclei with a total magnetic moment $\mu$ placed in a magnetic field H has an interaction energy described by the Hamiltonian:

$$\mathcal{H} = \mu H \quad (1)$$

Assuming the field to be in the z-direction, the eigenvalues of energy are $$E = \gamma_p \bar{h} H_z m \quad m = I, I-1, \ldots, -I \quad (2)$$

where $\bar{h}$ = Planck's constant and m = angular momentum

For hydrogen $I = \frac{1}{2}$ and $m = \frac{1}{2}, -\frac{1}{2}$ transition between these two states has an energy of $$\Delta E = \gamma_p \bar{h} H_z \quad (3)$$

or frequency associated with transition $$\omega = 2\pi f = \gamma_p H_z \quad (4)$$

The factor $\gamma_p$ for hydrogen nucleus (proton) is equal to $2.6753 \times 10^8$ radian.sec$^{-1}$.Tesla$^{-1}$. For a single electron in external magnetic field (spin $S = \frac{1}{2}$) the same formalism holds, but the gyromagnetic factor $\gamma_e$ is equal to $1.7576 \times 10^{11}$ radian.sec$^{-1}$.Tesla$^{-1}$ or 657 times higher, owing to the much lesser mass of electron. In a hydrogen atom we have a nucleus with spin $I = \frac{1}{2}$ coupled to an electron with a spin of $S = \frac{1}{2}$. The Hamiltonian for such system is $$\mathcal{H} = \gamma_e \bar{h} H_z S_z + A I \cdot S - \gamma_n \bar{h} H_z I_z \quad (5)$$

where A is a measure of coupling between the two spins. This expression is valid for the electron in the ground i.e. non-excited state. In so called strong field approximation i.e. when $\gamma_e h H_z >> A$ the Hamiltonian becomes $$\mathcal{H} = \gamma_e \bar{h} H_z S_z + A I_z S_z - \gamma_n \bar{h} H_z I_z \quad (6)$$

and the energy eigenvalues are then $$E = \gamma \bar{h} H_z M_s + A m_I \cdot m_s - \gamma_n \bar{h} H_z m_I; m_s = \pm \frac{1}{2}; m_I = \pm \frac{1}{2} \quad (7)$$

Figure 2:
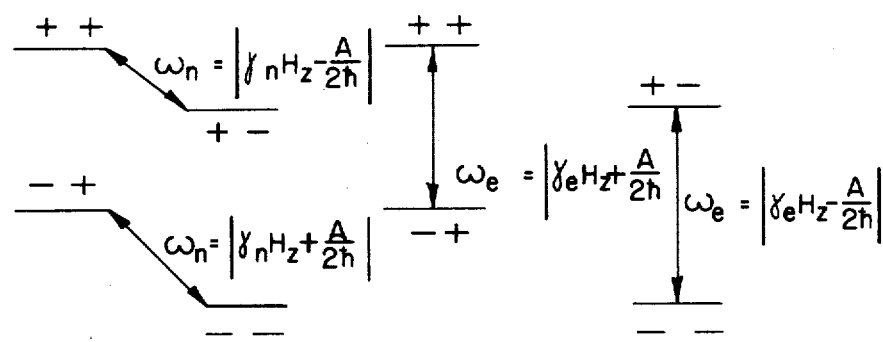
FIGS. 2 and 3 illustrate energy level diagrams.

There are four possible transitions in such a system, which are shown in FIG. 2. Symbol $+-$ means $m_s = +\frac{1}{2}, m_T = -\frac{1}{2}$ etc.

FIG. 2 is an energy level diagram showing the allowed transitions for an hydrogen atom in an external magnetic field $H_z$.

The resonant frequencies for electronic and nuclear transitions are correspondingly:

$$W_e = \gamma_e H_z + \frac{A}{\bar{h}} M_I \quad (8a)$$

$$W_n = \gamma_n H_z - \frac{A}{\bar{h}} M_S \quad (8b)$$

There exists an Overhauser-Pound Family of Double Resonances as described by Slichter in Principles of Magnetic Resonance, 2nd ed. Springer Velas, Berlin, 1978. In the nuclear Overhauser effect, one observes the change in the integrated intensity of the NMR absorption of a nuclear spin as a result of the concurrent saturation of another NMR resonance.

Figure 3:
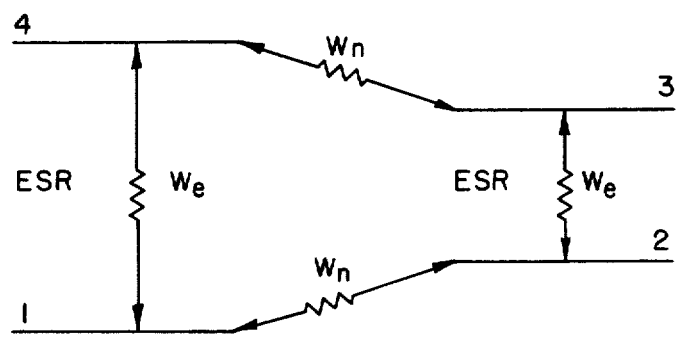

FIG. 3 shows an energy level diagram for $S = \frac{1}{2}$ and $I = \frac{1}{2}$ showing the transitions being 'pumped' or excited and observed transitions. $W_e$ and $W_n$ are nuclear and electronic relaxations. In Electron Nuclear Double Resonance (ENDOR) transitions 1-2 or 4-3 are pumped. In Electron Electron Double Resonance (ELDOR) transition 2-3 is pumped. The observed transition is 4-1. In the simple NMR the same transition is excited and its relaxation observed (4-3) or (1-2). If in addition another transition (e.g. 2-3 or 1-4) is excited, than the intensity of levels will be changed and change in intensity and apparent change in the relaxation rate will manifest itself in the monitored NMR transition, so if the ESR 'pumping' generator is amplitude modulated including pulsing on and off, this modulation will be transferred to the NMR signal. The limiting case of amplitude modulation is on-off pulsing. It may be expected that if the ESR pumping generator is frequency modulated instead of amplitude modulated, and if the frequency deviation is sufficiently high, it will have the same effect on the NMR signal.

There are two methods of establishing a very high frequency magnetic field which will satisfy conditions of ESR resonance in the principal field of the NMR imager. The ratio of ESR to NMR excitation frequencies which must be satisfied by the same principal field is in the range of 600 to 700. Preferably the ratio is equal to $\gamma_e/\gamma_n = 657$. An important factor is the choice of the ESR frequency. The sensitivity of the NMR readout increases with the intensity of the principal field. The imagers with the lowest magnetic field operate around B=0.03 T which corresponds to the NMR frequency for protons of 1.28 MHz and to the ESR frequency of 839 MHz. According to published data the (1/e) penetration depth at this frequency is 3.1 cm in the tissues with high water content and 20 cm in tissues with minimal water content (Radiofrequency Electromagnetic fields, NCRP Report 67, Wash., 1981). Thus, it may be possible to reach parts of the cerebral cortex and some other superficial structures, by means of surface coils. It may be possible to update the imager at a field lower than 0.03 T to remedy the penetration difficulties, however, sensitivity of the present method may be compromised. The unknown factor is the intensity of the very high frequency field that can be induced in the body in vivo. For this reason the ESR frequency source should operate with very narrow, high amplitude bursts of power, so that the average power level is tolerable.

In operation, the sample is placed inside the main magnetic field 10 and an RF pulse from a source 16 is applied by the coil 12 to excite to resonance a plurality of nuclear spins in the sample to produce an NMR signal. A microwave pulse from the generator 22, through the radiators 12 or 14, excites to resonance a plurality of electron spins in the sample. The modulator 26 operates to modulate the intensity of the microwave signal which results in the intensity of NMR signal being modulated. Typical modulation systems in ESR techniques are disclosed in U.S. Pat. No. 3,100,280. The modulator 26 may utilize either amplitude or frequency modulation to modulate the output of the generator. The modulation of the NMR signal is extracted from the NMR signal which then produces an image representative of the local ESR and thereby, the concentration of paramagnetic species in the sample. Conventional computer techniques can be utilized to extract the modulation from the NMR signal.

In another embodiment, paramagnetic tracers are introduced into the sample prior to placing the sample into the main magnetic field. Paramagnetic traces are introduced as contrast agents to improve the differentiation between tissues and also improve the detection of pathological changes. Paramagnetic substances shorten the proton relaxation times which result in signal intensity enhancement. A large variety of contrast agents have been suggested and tried in vivo. Of particular interest are chelates of gadolinium trivalent ion, nitroxides and molecular oxygen.

Figure 4:
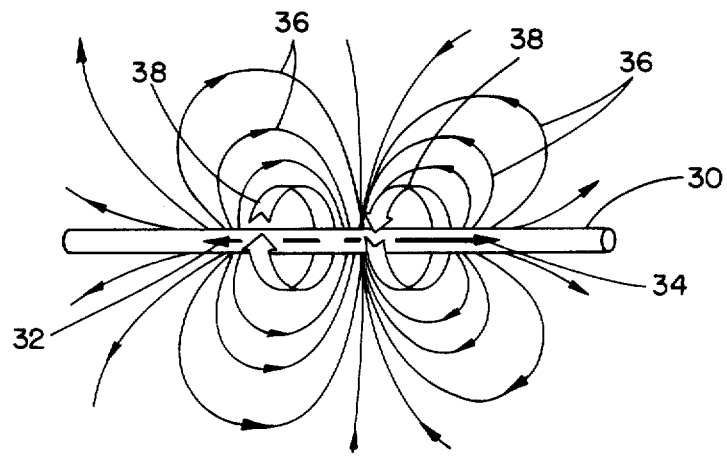
FIG. 4 is a schematic of the current distribution in an axon.

An expression of the electrical activity in the nervous system is the propagation of the nervous impulse or action potential, which originates at the body of a neuron and propagates along the axon. There are two current loops travelling along the axon. The first corresponds to the depolarization currents and the second is caused by the the repolarization currents. FIG. 4 shows the distribution of currents in an arbitrary plane incorporating an axon 30. See, Barach, et al., Experiments on the Magnetic Field of Nerve Action Potentials, J. Appl. Phys. 51 4532–4538, 1980. The action potential moves from left to right. The current inside the axon is represented by current dipoles shown as arrows 32,34. The current outside the axon, shown as symmetrical loops 36, flows through the intercellular medium and being axially symmetrical, with an axis coinciding with that of the axon 30, generates an axially symmetrical magnetic field. This field is shown in the form of wide bands 38 encircling the axon 30.

Figure 5:
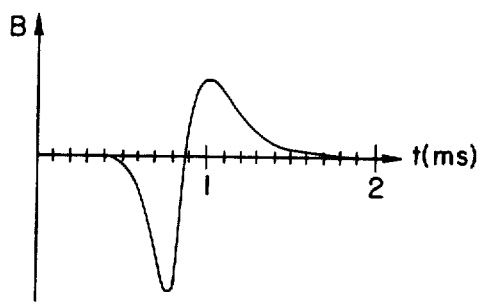
FIG. 5 is a graphical depiction of the magnetic field of an axon verses time.

The magnetic field of an axon in a conducting medium has been calculated and measured by Wikswo. See, Wikswo, Cellular Action Currents, Biomagnetism, Plenum NY, 1983. A typical form of the time dependence of magnetic field in the vicinity of an axon transmitting an action potential is shown in FIG. 5. FIG. 5 shows a magnetic field waveform in the vicinity of an axon in conducting medium during passage of an action potential. Only the magnitude but not the shape changes with the radial distance from the axon.

Figure 6:
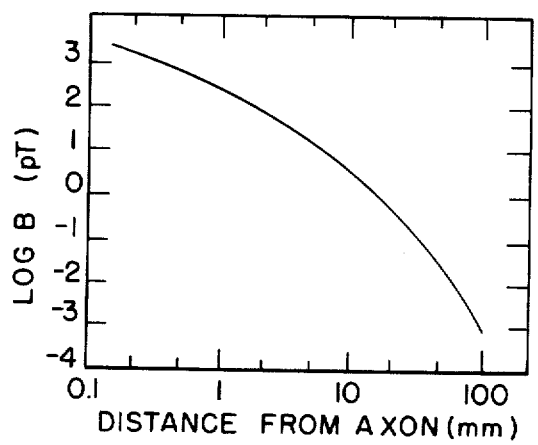
FIG. 6 is a graph showing the magnitude of the peak value of the magnetic field within the vicinity of a crayfish axon.

The magnitude of the magnetic field of an axon corresponding to the peak of the wave form is shown in FIG. 6. FIG. 6 shows the magnitude of the peak value of the magnetic field waveform in the vicinity of a crayfish axon.

As the technology of producing homogeneous magnetic fields improved, the observed width of NMR spectral lines became reduced. Factors influencing the width of a NMR spectral line can be divided into two categories: instrumental and physical. The main instrumental factor is the homogeneity of the principal magnetic field within the investigated volume and its constancy during the period of measurement. With the best of designs involving superconducting magnets and elaborate shielding systems, uniformity of the main field across a sample volume of about 1 cm$^3$ can be as high as one part per billion ($10^{-9}$). A similar degree of stability can be obtained for periods of minutes or even tens of minutes. If there were no other factors broadening the spectral lines the attainable line width would be as narrow as $10^{-9}$ on a relative scale.

The physical factors broadening the NMR lines are many and discussions concerning their contributions to the overall spectral line width are available in the literature. The main factors are connected with relaxation processes: spin-lattice and spin-spin characterized by characteristic time constants $T_1$ and $T_2$ respectively. These time constants are indicative of the average time the nucleus retains its polarization and it can be shown that for tissues like grey matter of the brain $T_2$ is much shorter than $T_1$ and thus provides a major contribution to the line width $\Delta f$.

$$\Delta f = 1/(\pi T_2) \tag{9}$$

For a $T_2$ value in the vicinity of 100 ms the line width is about 3 Hz. If the resonance frequency of NMR was set at 200 MHz the relative bandwidth is $1.6 \times 10^{-8}$. From FIG. 6 it can be seen that the magnetic field oi the action potential travelling along the axon produces at distances below 0.1 mm a field approaching $10^{-8}$T. This leads to the relative contribution of the field of a firing neuron in the region of $2 \times 10^{-9}$., i.e. 10% of the line width determined by $T_2$. This may be a measurable contribution in a brain with neuron density of about $10^7$ neurons cm$^{-3}$. A similar situation exists for NMR of $^{31}$P. However, the nucleus of $^{31}$P has a small quadrupole moment, which leads to some additional broadening of the resonance line.

In operation, the apparatus of FIG. 1 is used to image a plurality of NMR spectral lines from the modulated NMR signal. The NMR spectral lines have a defined width. Thereafter, the contribution of the spectral line width due to the electrical activity of the brain is measured which provides information on the electrical activity.

In addition, the method of detecting and measuring electrical activity of the brain of a human subject can be utilized in an NMR machine wherein the subject is placed in a spacially homogeneous main magnetic field and an RF pulse is applied to resonate a plurality of nuclear spins to produce an NMR signal. A plurality of NMR spectral lines are imaged from the NMR signal. The width of the spectral lines is broadened due to the discharge of a neuron in the brain which introduces an inhomogeneity in the main magnetic field. The broadening is measured and the contribution of the spectral line width due to the electrical activity is then determined. This provides a measurement of the neuron discharge current flux in the brain.

While several embodiments of the subject invention have been described and illustrated, it is obvious that various changes and modifications can be made therein without departing from the spirit of the present invention which should be limited only by the scope of the appended claims.

What is claimed is:

1. A method for imaging the concentration of paramagnetic species inside a sample comprising:
    placing the sample inside a main magnetic field;
    applying an RF pulse to excite to resonance a plurality of nuclear spins in said sample to produce an NMR signal;
    applying a microwave pulse to excite to resonance a plurality of electron spins in said sample;
    modulating the intensity of said microwave signal thereby modulating the intensity of said NMR signal; and
    extracting the modulation from said NMR signal to produce a signal forming an image representative of the local ESR and thereby the concentration of paramagnetic species in said sample.

2. The method of claim 1 wherein the RF pulse and microwave pulse simultaneously resonate said nuclear and electron spins.

3. The method of claim 1 further including the step of introducing paramagnetic tracers into the sample prior to placing the sample into the main magnetic field.

4. The method of claim 1 wherein the RF pulse and the microwave pulse are applied by energizing a coil arrangement with said RF pulse and said microwave pulse respectively.

5. The method of claim 1 wherein the intensity of the microwave signal is modulated by amplitude or frequency modulation.

6. The method of claim 1 wherein the frequency of the MW pulse is selected to be in a range between 600 to 700 times higher than the frequency of the RF pulse.

7. An apparatus for imaging the concentration of paramagnetic species inside a sample comprising:
    means for applying a main magnetic field to the sample;
    means for applying a RF pulse signal to excite to resonance a plurality of nuclear spins in said sample to produce an NMR signal;
    means for applying a microwave pulse signal to excite to resonance a plurality of electron spins in said sample;
    means for modulating the intensity of said MW pulse signal thereby modulating the intensity of said NMR signal;
    means for extracting the modulation from said NMR signal to produce an image representative of the local ESR and thereby the concentration of paramagnetic species in said signal.

8. The apparatus of claim 7 wherein said RF pulse means and said microwave pulse means resonate said nuclear and electron spins simultaneously.

9. The apparatus of claim 8 wherein said means for applying a RF pulse includes a resonance coil arrangement within said main magnetic field means, said resonance coil arrangement being coupled to a RF power source.

10. The apparatus of claim 9 wherein said means for applying a microwave pulse includes a microwave radiator within said main magnetic field, said microwave radiator being coupled to a MW power generator.

11. The apparatus of claim 10 wherein said MW radiator is said resonance coil.

12. The apparatus of claim 10 wherein said MW radiator is a transmission horn.

13. The apparatus of claim 10 wherein said MW radiator is a slotted transmission line.

14. The apparatus of claim 11 wherein said resonance coil is a saddle-shaped coil utilized as a distributed transmission line and resonator.

15. The apparatus of claim 11 wherein said resonance coil is a helicoidal coil incorporating a slot high frequency transmission system.

16. The apparatus of claim 7 further including means for introducing paramagnetic tracers into said sample.

17. The apparatus of claim 11 wherein said resonance coil is a surface coil.

18. The apparatus of claim 10 wherein said means for modulating the intensity of said MW pulse signal includes means for amplitude modulating the MW power generator output.

19. The apparatus of claim 10 wherein said means for modulating the intensity of said MW pulse signal includes means for frequency modulating the MW power generator output.

20. The method of claim 1 further including the steps of:
    imaging a plurality of NMR spectral lines from said modulated NMR signal, said NMR spectral lines having a defined width; and
    measuring the contribution of said spectral line width due to the electrical activity of the brain thereby providing information on said electrical activity.

21. A method of detecting and measuring electrical activity of the brain of a subject using NMR techniques comprising:
    placing a subject inside a spatially homogeneous main magnetic field;
    applying a RF pulse to excite to resonance a plurality of nuclear spins to produce an NMR signal;
    imaging a plurality of NMR spectral lines from said NMR signal, said NMR spectral lines having a defined width, the width of said spectral lines being broadened beyond said defined width due to electrical activity in the brain of said subject; and
    measuring the contribution of said spectral line width due to said electrical activity of the brain thereby providing information on said electrical activity.

22. The method of claim 21 wherein said main magnetic field is maintained consistently stable during the period of measurement.

23. The method of claim 21 wherein the discharge of a neuron in the brain introduces an inhomogeneity in the main magnetic field which can be measured as a broadening of the NMR spectral lines thereby providing a measurement of the neuron discharge current flux in the brain.

* * * * *

UNITED STATES PATENT AND TRADEMARK OFFICE
CERTIFICATE OF CORRECTION

PATENT NO. : 4,719,425

DATED : January 12, 1988

INVENTOR(S) : Kamil V. Ettinger

It is certified that error appears in the above-identified patent and that said Letters Patent is hereby corrected as shown below:

Column 4, line 18:

"$E = \gamma' \hbar H_z M_s + A m_I \cdot m_s - \gamma_n \bar{\hbar} H_z m_I m_s = \pm 1/2; m_I = \pm 1/2$" should read as --$E = \gamma e \hbar H_z M_s + A m_I \cdot M_s - \gamma n \hbar H_z M_I$ $M_s = \pm 1/2; M_I = \pm 1/2$--

Column 4, line 31: "$\frac{A}{h}$" should read as --$\frac{A}{\hbar}$--

Column 4, line 36: "$\frac{A}{h}$" should read as --$\frac{A}{\hbar}$--

Column 6, line 55: "oi" should read as --of--

Signed and Sealed this

Twenty-eighth Day of June, 1988

Attest:

DONALD J. QUIGG

Attesting Officer  Commissioner of Patents and Trademarks